US010615290B2

(12) United States Patent
Hekmatshoartabari et al.

(10) Patent No.: US 10,615,290 B2
(45) Date of Patent: Apr. 7, 2020

(54) NORMALLY-OFF JUNCTION FIELD-EFFECT TRANSISTORS AND APPLICATION TO COMPLEMENTARY CIRCUITS

(71) Applicant: International Business Machines Corporation, Armonk, NY (US)

(72) Inventors: Bahman Hekmatshoartabari, White Plains, NY (US); Ghavam G. Shahidi, Pound Ridge, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/014,865

(22) Filed: Jun. 21, 2018

(65) Prior Publication Data

US 2018/0301567 A1 Oct. 18, 2018

Related U.S. Application Data

(63) Continuation of application No. 15/377,703, filed on Dec. 13, 2016, now Pat. No. 10,038,104, which is a
(Continued)

(51) Int. Cl.
*H01L 29/80* (2006.01)
*H01L 29/808* (2006.01)
*H01L 27/06* (2006.01)
*H01L 29/812* (2006.01)
*H01L 29/16* (2006.01)
(Continued)

(52) U.S. Cl.
CPC ...... *H01L 29/8086* (2013.01); *H01L 27/0617* (2013.01); *H01L 27/098* (2013.01); *H01L 29/1066* (2013.01); *H01L 29/1604* (2013.01); *H01L 29/802* (2013.01); *H01L 29/8124* (2013.01); *H01L 29/8126* (2013.01); *H01L 29/868* (2013.01)

(58) Field of Classification Search
None
See application file for complete search history.

(56) References Cited

U.S. PATENT DOCUMENTS 4,633,281 A 12/1986 Benjamin et al.
4,670,764 A 6/1987 Benjamin et al.
(Continued)

FOREIGN PATENT DOCUMENTS

JP 62-120064 A 6/1987
JP 10-12887 A 1/1998

OTHER PUBLICATIONS

International Search Report dated Apr. 9, 2015, received in a corresponding foreign application.
(Continued)

*Primary Examiner* — Evren Seven
(74) *Attorney, Agent, or Firm* — Scully, Scott, Murphy & Presser, P.C.; L. Jeffrey Kelly, Esq.

(57) ABSTRACT

A junction field-effect transistor (JFET) with a gate region that includes two separate sub-regions having material of different conductivity types and/or a Schottky junction that substantially suppresses gate current when the gate junction is forward-biased, as well as complementary circuits that incorporate such JFET devices.

17 Claims, 17 Drawing Sheets

100a
108c
105
120
114
110b
101
110a
103
112
108a
108b
116
106a
106b
104
102

Related U.S. Application Data continuation of application No. 14/591,022, filed on Jan. 7, 2015, now Pat. No. 9,543,290.

(60) Provisional application No. 61/930,519, filed on Jan. 23, 2014.

(51) Int. Cl.

| | |
|---|---|
| ***H01L 27/098*** | (2006.01) |
| ***H01L 29/10*** | (2006.01) |
| *H01L 29/868* | (2006.01) |

(56) References Cited

U.S. PATENT DOCUMENTS

| | | | |
|---|---|---|---|
| 5,670,804 | A | 9/1997 | Usagawa et al. |
| 6,049,110 | A | 4/2000 | Koh |
| 6,306,691 | B1 | 10/2001 | Koh |
| 7,476,600 | B1 | 1/2009 | Atanackovic |
| 7,855,135 | B2 | 12/2010 | Chang et al. |
| 8,169,032 | B2 | 5/2012 | Ramaswamy et al. |
| 8,232,585 | B2 | 7/2012 | Mouli |
| 8,466,017 | B2 | 6/2013 | Sheridan et al. |
| 8,623,722 | B2 | 1/2014 | Mouli |
| 9,202,703 | B2 | 12/2015 | Hagleitner et al. |
| 2003/0098477 | A1 | 5/2003 | Nambu |
| 2007/0131975 | A1 | 6/2007 | Shannon et al. |
| 2007/0262793 | A1* | 11/2007 | Kapoor ............... H01L 29/8086 326/101 |
| 2008/0272402 | A1 | 11/2008 | Saha et al. |
| 2010/0019291 | A1 | 1/2010 | Mouli |
| 2010/0327330 | A1 | 12/2010 | Eklund |
| 2012/0038009 | A1 | 2/2012 | Toh et al. |
| 2012/0205724 | A1 | 8/2012 | Bracale et al. |
| 2012/0262418 | A1 | 10/2012 | Lee |
| 2012/0302015 | A1 | 11/2012 | Mouli |
| 2013/0075831 | A1 | 3/2013 | Jangjian et al. |
| 2013/0146890 | A1 | 6/2013 | Hwang et al. |
| 2013/0285124 | A1 | 10/2013 | Mouli |
| 2013/0328110 | A1 | 12/2013 | Hekmatshoar-Tabari et al. |

OTHER PUBLICATIONS

Bedell et al., "Kerf-Less Removal of Si, Ge, and 111-V Layers by Controlled Spalling to Enable Low-Cost PV Technologies", IEEE Journal of Photovoltaics, Apr. 2012, pp. 141-147, vol. 2, No. 2.

Choi et al., "41.4: AMOLED based on Silicon-On-Glass {SiOG) Technology", SID 07 Digest, 2007, pp. 1378-1381.

Dross et al., "Stress-induced large-area lift-off of crystalline Si films", Appl. Phys. A 89, Published online: Jul. 5, 2007, pp. 149-152.

Hekmatshoar et al., "Characterization of thin epitaxial emitters for high-efficiency silicon heterojunction solar cells", Applied Physics Letters 101, 103906 (2012), © 2012 American Institute of Physics.

Hekmatshoar et al., "Highly stable amorphous-silicon thin-film transistors on clear plastic", Applied Physics Letters, 2008, 93, 032103, © 2008 American Institute of Physics.

Hekmatshoar, "Normally-Off Thin-Film Silicon Heterojunction Field-Effect Transistors and Application to Complementary Circuits", IEEE Electron Device Letters, May 2014, pp. 545-547, vol. 35, No. 5, Grace Period Disclosure Document.

Hekmatshoar et al., "Reliability of Active-Matrix Organic Light-Emitting-Diode Arrays With Amorphous Silicon Thin-Film Transistor Backplanes on Clear Plastic", IEEE Electron Device Letiers, Jan. 2008, pp. 63-66, vol. 29, No. 1.

Hekmatshoar, "Thin-Film Heterojunction Field-Effect Transistors With Crystalline Si Channels and Low-Temperature PECVD Contacts", IEEE Electron Device Letters, Jan. 2014, pp. 81-83, vol. 35, No. 1.

Hekmatshoar et al., "Tradeoff regimes of lifetime in amorphous silicon thin-film transistors and a universal lifetime comparison framework", Applied Physics Letters, 2009, 95,143504.

Manley et al., "Development of Integrated Electronics on Silicon-on-Glass (SiOG) Substrate", ECS Transactions, 2008, pp. 371-380, 16 (9) © The Electrochemical Society.

Shahrjerdi et al., "Low-Temperature Epitaxy of Compressively Strained Silicon Directly on Silicon Substrates", Journal of Electronic Materials, published online Nov. 17, 2011, pp. 494-497, vol. 41, No. 3.

Taguchi et al., "241% Record Efficiency HIT Solar Cell on Thin Silicon Wafer", IEEE Journal of Photovoltaics, Jan. 2014, pp. 96-99, vol. 4, No. 1.

Wagner "Amorphous silicon: Vehicle and test bed for large-area electronics", Phys. Status Solidi A. 207, 2010, pp. 501-509, No. 3.

U.S. Appl. No. 61/930,519, entitled "Heterojunction Field-Effect Transistor and Complementary Circuits using the same", filed Jan. 23, 2014.

Gadkaree, et al., "Single-crystal silicon films on glass", J. Mater. Res. Sep. 2007, pp. 2363-2367, vol. 22, No. 9.

List of IBM Patents or Patent Applications Treated as Related dated Jun. 21, 2018, 2 pages.

Great Britain Examination Report dated Apr. 23, 2019 received from Great Britain Patent Application No. GB 1613996.6.

* cited by examiner

200

400

500a

500b

NORMALLY-OFF JUNCTION FIELD-EFFECT TRANSISTORS AND APPLICATION TO COMPLEMENTARY CIRCUITS

STATEMENT ON PRIOR DISCLOSURES BY AN INVENTOR

The following disclosure(s) are submitted under 35 U.S.C. § 102(b)(1)(A) as prior disclosures by, or on behalf of, a sole inventor of the present application or a joint inventor of the present application:

(i) Hekmatshoar, Bahman, "Normally-Off Thin-Film Silicon Heterojunction Field-Effect Transistors and Application to Complementary Circuits," IEEE Electron Device Letters, Vol. 35, No. 5, May 2014 (issue date), Mar. 14, 2014 (publication date).

BACKGROUND OF THE INVENTION

The present invention relates generally to the field of junction field-effect transistors (JFETs), and more particularly to structures for thin-film JFETs.

Hydrogenated amorphous silicon (a-Si:H) enjoys widespread use in the production of thin-film transistors (TFTs), image sensors, photo-receptors and solar cells. This material is typically grown by plasma-enhanced chemical vapor deposition (PECVD) at temperatures close to 200° C., suitable for low-cost, large-area substrates. Low-cost, large-area processing is highly desirable for applications in large-area electronics, such as the fabrication of TFT backplanes for active-matrix displays.

However, applications requiring large and stable drive currents such as high-resolution active-matrix organic light-emitting diode displays pose some challenges to the use of a-Si:H TFTs. Large-area deposition techniques are typically suited for growing non-crystalline materials, but devices constructed from these materials suffer from inferior performance relative to those made from crystalline materials. At the same time, processing single-crystalline devices typically requires a complementary metal-oxide-semiconductor (CMOS) foundry, which is too expensive for large-area electronics and displays.

With the advent of various layer-transfer techniques to enable the transfer of thin layers of crystalline silicon (c-Si) onto low-cost substrates such as glass or plastic, thin-film heterojunction field-effect transistor (HJFET) devices with c-Si channels and PECVD contact regions are known.

SUMMARY

According to an aspect of the present invention, there is a junction field effect transistor (JFET) that includes a channel region and a gate region. The gate region includes a first gate sub-region and a second gate sub-region. The first gate sub-region forms a junction with the channel region. The second gate sub-region forms a junction with the first gate sub-region. The channel region and the second gate sub-region include material of a first conductivity type. The first gate sub-region includes material of a second conductivity type different from the first conductivity type.

According to another aspect of the present invention, there is a complementary circuit that includes a junction field effect transistor (JFET) and a metal-oxide-semiconductor field-effect transistor (MOSFET), each having a gate, drain, and source electrode and a channel region. The JFET includes a gate region. The gate region of the JFET includes a first gate sub-region and a second gate sub-region. The first gate sub-region forms a junction with the JFET channel region. The second gate sub-region forms a junction with the first gate sub-region. The MOSFET and JFET channel regions and the second gate sub-region include material of a first conductivity type. The first gate sub-region includes material of a second conductivity type different from the first conductivity type. At least one of the gate, drain or source electrode(s) of the JFET is electrically connected to the gate, drain, or source electrode(s), respectively, of the MOSFET.

According to another aspect of the present invention, there is a junction field effect transistor (JFET) that includes a channel region and a gate region. The gate region forms a junction with the channel region. The gate region includes at least one Schottky junction. The gate region includes a blocking stack.

DETAILED DESCRIPTION

Figure 1A:
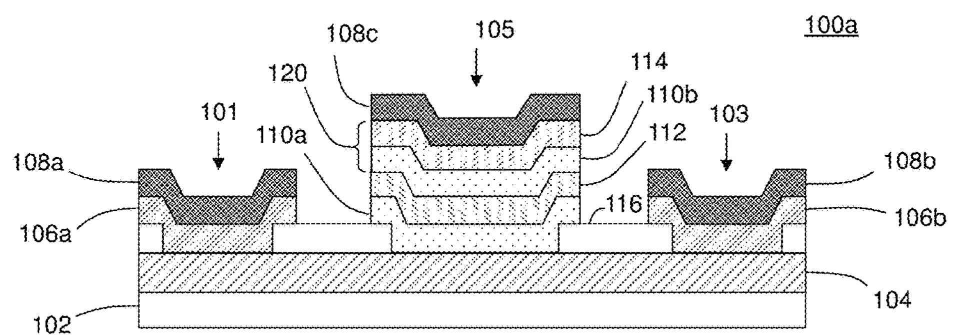
FIG. 1A is a cross-sectional view of a first embodiment semiconductor structure according to the present invention.

Some embodiments of the present invention recognize: (i) that thin-film heterojunction field-effect transistor (HJFET) devices with c-Si channels and PECVD contact regions (a) can be processed on thin single-crystalline substrates using the mainstream large area deposition techniques used for non-crystalline materials (for example, amorphous Si) and/or (b) provide substantially higher performance than a-Si:H TFTs; (ii) that the c-Si channel of such HJFET devices can be also formed by recrystallized polycrystalline silicon (poly-Si) using various known techniques; (iii) that the gate region of such an HJFET may be comprised of a-Si:H structurally similar to the emitter of heterojunction solar cells with intrinsic thin layers; (iv) that the source and drain regions may be comprised of hydrogenated crystalline silicon (c-Si:H) grown epitaxially on c-Si using the same PECVD reactor as a-Si:H at temperatures close to 200° C. (well below 250° C.); and/or (v) that this approach allows the use of existing a-Si:H deposition infrastructure for the fabrication of such HJFET devices.

In some embodiments of the present invention, a blocking structure is incorporated into the gate stack of a junction field-effect transistor (JFET) device to substantially suppress the gate current when the gate junction is forward-biased. As a result, normally-OFF JFET devices with MOSFET-like characteristics are obtained. The JFET devices are comprised of gate, source and drain regions and may be formed, for example, by plasma-enhanced chemical vapor deposition (PECVD) on thin-film crystalline Si (c-Si) substrates at temperatures below 200° C. (well below 250° C.). The HJFET devices can be integrated with MOSFET devices fabricated on the same c-Si substrates to form complementary circuits.

Some embodiments of the present invention recognize one or more of the following facts, potential problems and/or potential areas for improvement with respect to the current state of the art: (i) a JFET or HJFET has a simpler structure than a MOSFET; (ii) advantages of the HJFET structure over the more commonly-used metal-oxide-semiconductor field-effect transistor (MOSFET) include the established stability of the a-Si:H/c-Si heterojunction as well as lower operating voltages due to the elimination of the low-temperature gate dielectric; (iii) despite these advantages, HJFET devices are prone to high gate leakages if the gate heterojunction is forward-biased; and/or (iv) this shortcoming limits the practical application of HJFET devices to normally-ON transistors.

As a result, some embodiments of the present invention may include one or more of the following features, characteristics and/or advantages: (i) a JFET and/or HJFET structure with an improved gate stack to block gate current at forward bias; (ii) normally-OFF devices which are not possible with conventional JFET or known HJFET structures; (iii) use of the same deposition techniques compatible with mainstream large-area processing for producing the devices of (i) and/or (ii); (iv) usage in the pixel circuits of active-matrix organic light-emitting diode (AMOLED) backplanes; and/or (v) the formation of complementary circuits through interconnection of the devices of (i) and/or (ii) with MOSFET devices fabricated on the same substrate.

Some embodiments of the present invention recognize: (i) that the features, characteristics and/or advantages described above may be of value for integrating AMOLED backplane driver/control circuitry on the same substrate as the HJFET backplane; (ii) they the features, characteristics and/or advantages described above may be of value for realizing complementary circuits for other applications in large-area electronics, such as logic and memory, provided that sufficiently reliable MOSFET devices are available; (iii) that reliability requirements for such applications are generally less stringent than those for the driver transistor in an AMOLED pixel, which is operated in direct current (DC) (that is, with a 100% duty cycle); (iv) that conventional complementary circuits with p-channel and n-channel MOSFETs on silicon-on-glass (SiOG) substrates require process temperatures of up to 600° C. for the activation of the $p^+$ and $n^+$ implanted source and drain regions; (v) that channel implantation is desired for adjusting the threshold voltage and reducing the sensitivity of the threshold voltage to parasitic fixed and/or trapped charge associated with the insulating substrate (for example, buried oxide (BOX) or glass); (vi) that high activation temperatures such as in (iv) preclude the use of a wide range of low-cost and flexible substrates; and/or (vii) that in contrast, some embodiments of the present invention require only one type of substrate doping, thereby eliminating the need for further substrate doping after substrate preparation.

Some embodiments of the present invention may include a complementary circuit scheme wherein the combination of an n-channel HJFET and a p-channel MOSFET includes an n-channel HJFET that provides a higher drive current than a p-channel HJFET (due to the higher mobility of electrons than holes) as well as a p-channel MOSFET that is far less sensitive to floating-body effects such as early break-down/kink effect than an n-channel MOSFET, and/or wherein the HJFET devices are expected to be immune to floating body effects regardless of the substrate type (because the parasitic bipolar transistor inherent to the MOSFET structure does not exist in the HJFET structure).

Some embodiments of the present invention recognize: (i) that normally-OFF HJFET devices can be created by incorporating an a-Si:H blocking stack in the gate heterojunction to substantially suppress the gate leakage at forward-bias conditions; and/or (ii) that such HJFET devices can be integrated with MOSFETs on the same c-Si substrate to achieve complementary circuits.

Figure 1B:
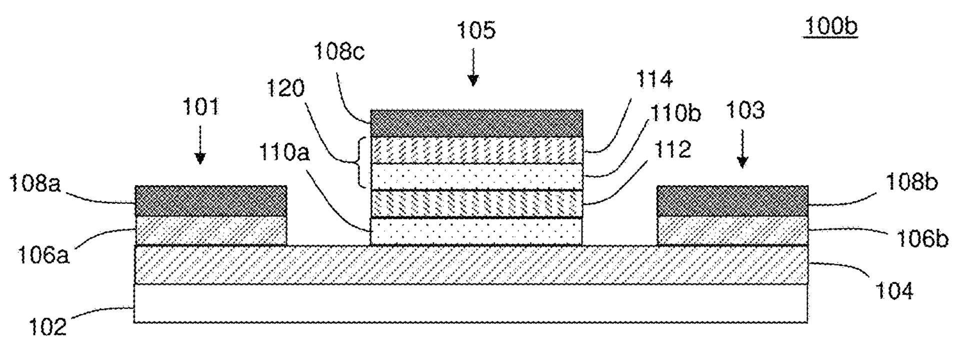
FIG. 1B is a cross-sectional view of a second embodiment semiconductor structure according to the present invention.

Shown in FIGS. 1A and 1B are schematic cross-sectional views of HJFETs 100*a* and 100*b*, respectively, which are two variations on embodiments of the present invention.

These and other embodiments may be formed, for example, through any of the general processes described in Hekmatshoar-Tabari et al., “Thin film hybrid junction field effect transistor,” US Patent Publication No. 20130328110 A1, filed Mar. 15, 2013, the entire content of which (including all text and all drawings) is hereby “incorporated by reference” (meaning that the content of the incorporated document should be considered as having been explicitly set forth in this document).

HJFETs 100*a* and 100*b* each include: insulating substrate 102; crystalline semiconductor material 104 of a first conductivity type; drain stack 101; source stack 103; gate stack 105; doped hydrogenated crystalline semiconductor material of the first conductivity type 106*a* and 106*b*; conductive (for instance, metal) electrode contacts 108*a*, 108*b*, and 108*c*; optional intrinsic hydrogenated non-crystalline semiconductor material 110*a* and 110*b*; doped hydrogenated non-crystalline semiconductor material of a second conductivity type 112 which is opposite the first conductivity type; and doped hydrogenated non-crystalline semiconductor material of the first conductivity type 114. HJFET 100*a* also includes passivation material layer portions 116. In both HJFETs 100*a* and 100*b*, layer 114 (together with optional intrinsic layer 110*b*, when present) of gate stack 105 is also referred to herein as add-on layer, or blocking stack, 120.

As used herein, a conductivity type may be either: (i) p-type, where “holes” act as majority charge carriers, such as in a semiconductor material doped with impurities that create a deficiency of valence electrons; or (ii) n-type, where electrons act as majority charge carriers, such as a semiconductor material doped with impurities that contribute free electrons. Where dopants are used, their presence in a material may be graded or uniform.

The various components of HJFETs 100*a* and 100*b* are arranged as shown in the Figures. In these particular embodiments, the HJFETs are of the thin-film silicon variety, with the gate stack being of a-Si:H formed via a PECVD process at 200° C., and the source and drain stacks being of c-Si:H also formed via a PECVD process at 200° C. The insulating substrate 102 is buried oxide (BOX), the first conductivity type is n-type, and crystalline semiconductor material 104 is n-type c-Si silicon on insulator (SOI) having a doping concentration $N_D$=~$5\times10^{17}$ atoms/$cm^3$ and a channel thickness $t_{Si}$=32 nm. Transferred silicon or polycrystalline silicon (poly-Si) are other practical alternatives for the semiconductor substrate. The second conductivity type is p-type. End-to-end device length L=40 μm, and the length of gate 105 is 10 μm. Passivation material layer portions 116 are of an oxide insulator material. Doped hydrogenated crystalline semiconductor material 106*a* and 106*b* are $n^+$ c-Si:H, intrinsic hydrogenated non-crystalline semiconductor material 110*a* and 110*b* are i a-Si:H, doped hydrogenated non-crystalline semiconductor material 112 is $p^+$ a-Si:H, and doped hydrogenated non-crystalline semiconductor material 114 is $n^+$ a-Si:H.

Some embodiments of the present invention recognize that, for embodiments similar to those of FIGS. 1A and 1B but without add-on layer 120, desirable characteristics include low voltage and moderate subthreshold slope (for example, a pinch-off voltage $V_P$=−0.6 V and a subthreshold slope of ~70 mV/dec (decade) for a device with a doping concentration of substrate 104 of $N_D$=~$2\times10^{18}$ $cm^{-3}$), but undesirable characteristics include a gate junction that must remain reverse biased so a normally-OFF device is not possible. For such embodiments, the pinch-off voltage can be approximated by the following equation:

$$V_P \approx V_{bi} - (q \times N_D / 2 \times \varepsilon_{Si}) \times t_{Si}^2$$

where $V_{bi}$ is the built-in potential, q is the electron charge, and $\varepsilon_{Si}$ is the permittivity of silicon. While $V_P$ can be negative, or positive up to $V_{bi}$, the gate junction is forward-biased at positive voltages, so $V_P$ must be chosen negative to avoid large gate currents, resulting in a normally-ON device. In addition, regardless of whether the device is normally-ON or normally-OFF, a large gate leakage, typical in conventional JFET devices, is undesirable.

To elaborate, it is evident from the above equation that $V_P$ of a c-Si-based HJFET device depends on the c-Si substrate doping ($N_D$) and thickness ($t_{Si}$). For an n-type c-Si substrate, a negative $V_P$ corresponds to a normally-ON device, where the channel in ON at zero gate bias and a negative gate bias is needed to pinch-off the channel. At negative gate biases, the gate heterojunction is reversed-biased and therefore the gate current is small. Reducing the channel doping and/or thickness can result in a positive $V_P$ corresponding to a normally-OFF device, where the channel is pinched-off at zero gate bias and a positive gate voltage is needed to turn on, or un-pinch, the channel. However, positive gate voltages forward bias the gate heterojunction, resulting in large gate currents.

Figure 2:
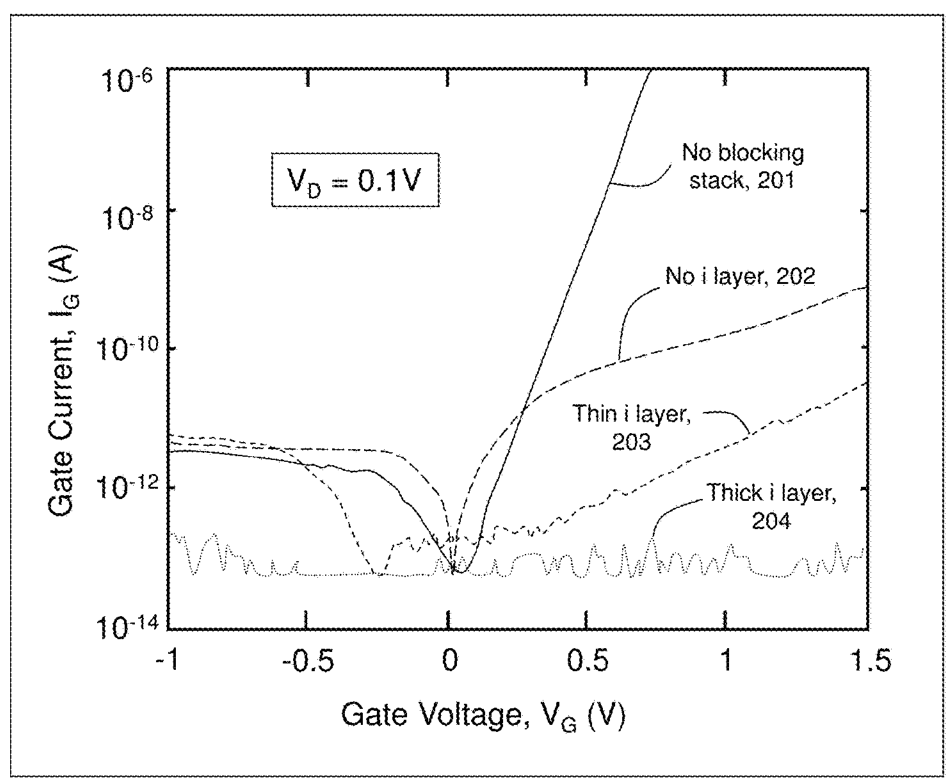
FIG. 2 is a first graph showing information that is generated by and/or helpful in understanding embodiments of the present invention.

In some embodiments of the present invention, this issue is addressed by adding an $n^+$ a-Si:H/i a-Si:H blocking stack to the HJFET gate. The embodiments of FIGS. 1A and 1B, with blocking stack 120, exemplify this approach. Blocking stack 120 forms an n-i-p a-Si:H diode (114, 110*b*, and 112) in series with the p-i-n gate heterojunction (112, 110*a*, and 104). When the gate heterojunction is forward biased, the gate current is limited by the reverse biased n-i-p a-Si:H diode. The gate current is reduced by increasing the thickness of the i a-Si:H layer in the blocking stack, as expected from the operation principles of an n-i-p a-Si:H diode. This situation is illustrated in graph 200 of FIG. 2, showing the gate current of a FIG. 1A-like HJFET with no blocking stack 120 (line 201), no i layer 110*b* (line 202), a thin (<10 nm) i layer 110*b* (line 203), and a thick (~75 nm) i layer 110*b* (line 204).

Figure 3A:
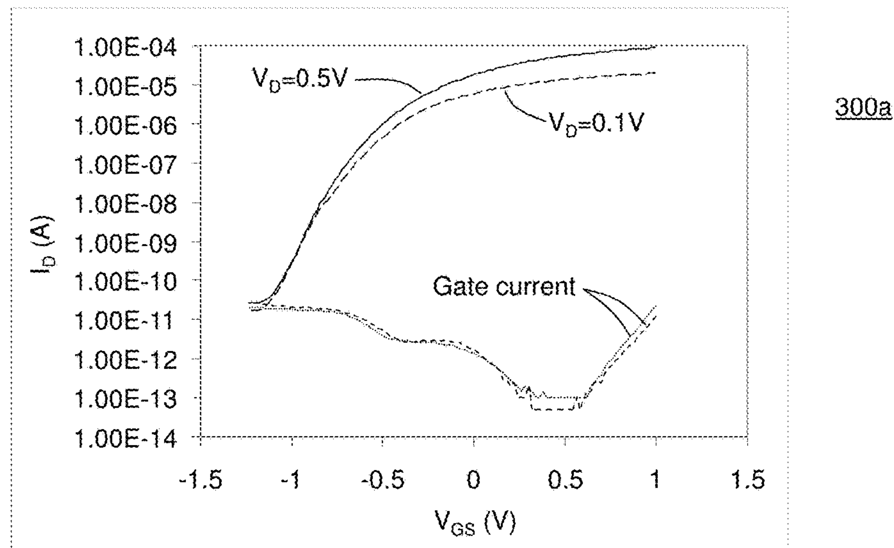
FIG. 3A is a second graph showing information that is generated by and/or helpful in understanding embodiments of the present invention.
Figure 3B:
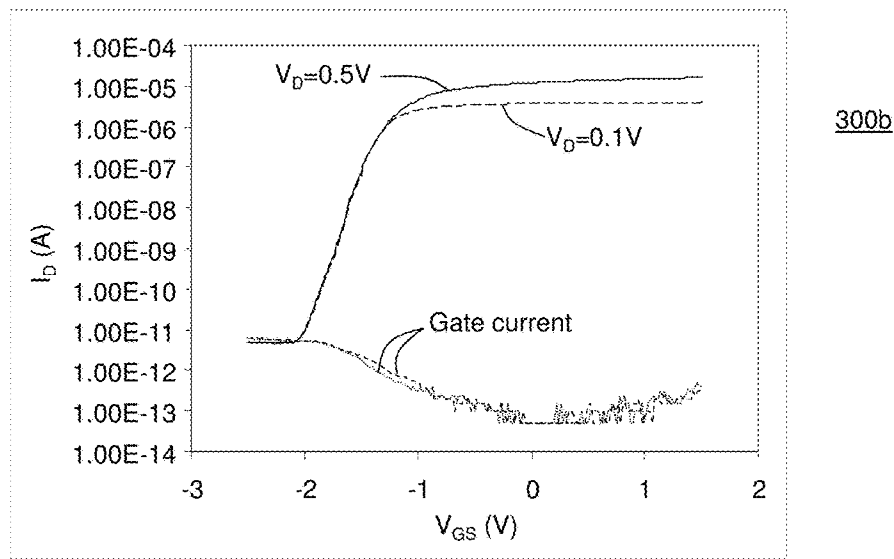
FIG. 3B is a third graph showing information that is generated by and/or helpful in understanding embodiments of the present invention.

Another example is illustrated in graphs 300*a* and 300*b* of FIGS. 3A and 3B, respectively. In addition to showing drain current as a function of gate-source voltage, these graphs show gate current for FIG. 1A-like embodiments where the doping concentration of substrate 104 is $N_D$=~$2\times10^{18}$ $cm^{-3}$. FIG. 3A illustrates performance for a device with a 10 nm i a-Si:H layer 110*b* in the blocking stack, while FIG. 3B illustrates performance for a device with a 100 nm i a-Si:H layer 110*b* in the blocking stack. In both cases, blocking gate stack 120 substantially blocks the gate current at positive gate voltage. The thicker i a-Si:H layer is shown to be more effective, but may not be necessary depending on the requirements of the application.

Figure 4:
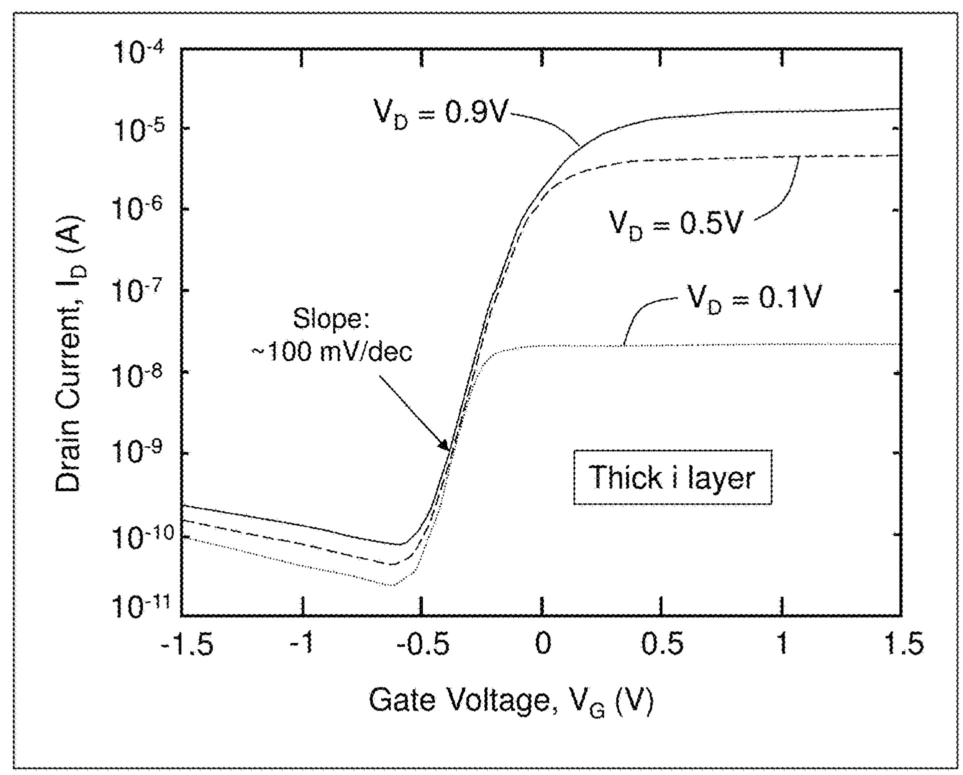
FIG. 4 is a fourth graph showing information that is generated by and/or helpful in understanding embodiments of the present invention.

Graph 400 of FIG. 4 returns to the FIG. 1A-like HJFET with a thick (~75 nm) i layer 110*b* in the gate blocking stack, showing its transfer characteristics. While a thick i a-Si:H layer 110*b* such as this one of ~75 nm reduces the gate current to a very low level (close to the measurement limit of the parameter analyzer used for the examples of Figures), it also results in poor device electrostatics. This is evidenced from the increased subthreshold slope of ~100 mV/dec (as opposed to ~75 mV/dec without a blocking stack) and large off-current, on the order of $10^{-10}$ A (instead of closer to $10^{-12}$) seen in FIG. 4. These results are attributed to the increased gate capacitance due to the thick i a-Si:H layer. In addition, the pinch-off voltage $V_P$ shifts to the left (from ~0.18 V to ~−0.3 V) and the drive current is reduced relative to a similarly structured non-blocking-layer device due to the gate voltage drop across the thick i a-Si:H layer.

Figure 5A:
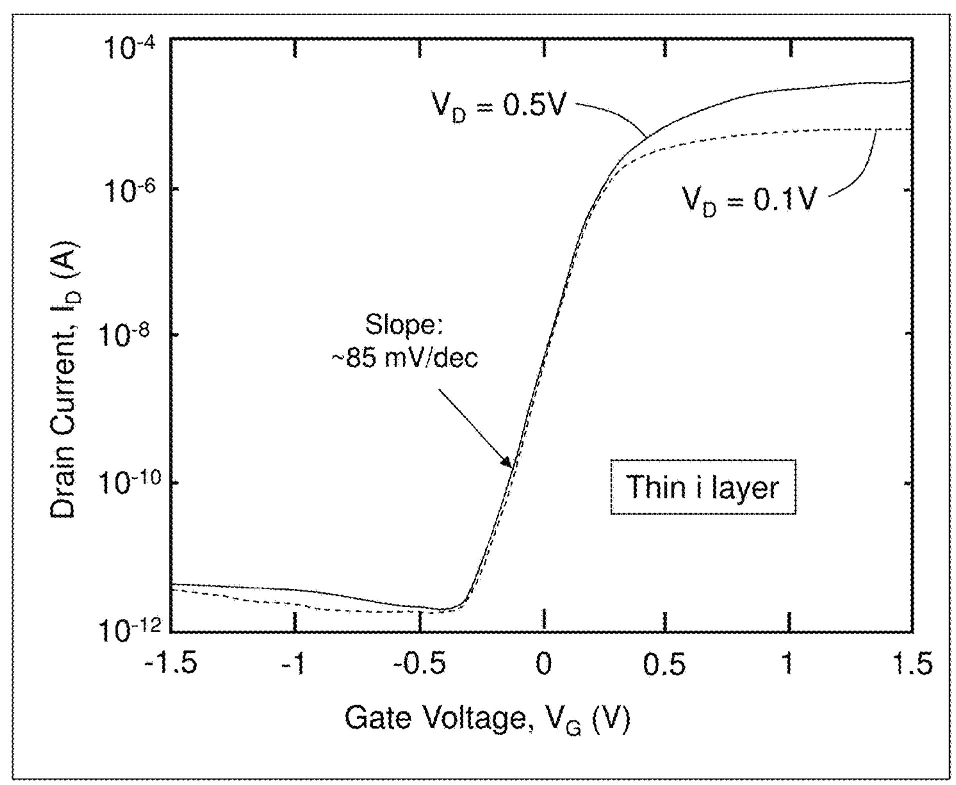
FIG. 5A is a fifth graph showing information that is generated by and/or helpful in understanding embodiments of the present invention.
Figure 5B:
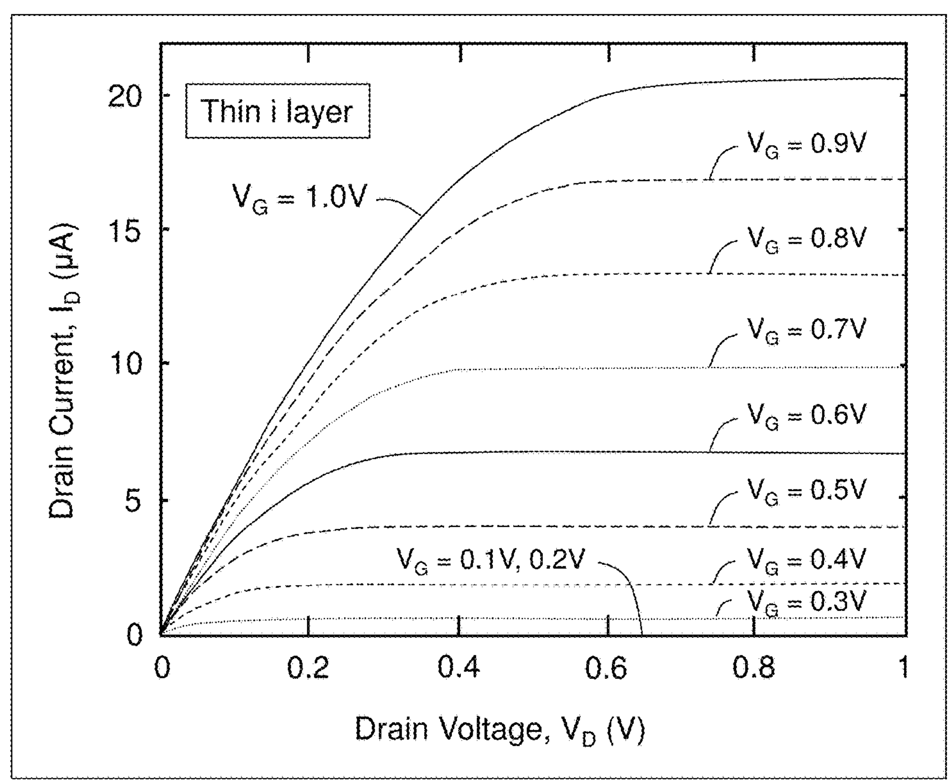
FIG. 5B is a sixth graph showing information that is generated by and/or helpful in understanding embodiments of the present invention.

In contrast, a thin i a-Si:H layer (<10 nm) can still substantially suppress the gate current (by over six orders of magnitude) with only a small penalty in device characteristics. This situation is illustrated in graphs 500_a_ and 500_b_ of FIGS. 5A and 5B, showing transfer and output characteristics, respectively, of a FIG. 1A-like HJFET with a thin i a-Si:H layer 110_b_ in blocking stack 120. The increase of subthreshold slope is ~10 mV/dec over the no blocking stack case (of ~75 mV), the reduction of $V_P$ is ~60 mV (from ~0.18 V to ~0.12 V), and the increase of OFF current is negligible. The total thickness of the a-Si:H gate stack (including the blocking stack) is below 50 nm.

Figure 6:
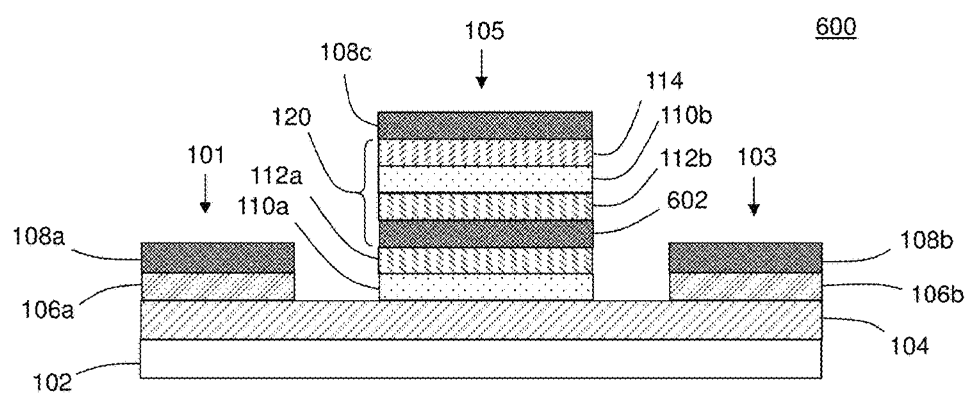
FIG. 6 is a cross-sectional view of a third embodiment semiconductor structure according to the present invention.

In some embodiments of the present invention: (i) the purpose of the add-on layer is to oppose gate current at positive bias; (ii) the i a-Si:H layer in the add-on layer is optional and may be omitted; and/or (iii) an optional conductive layer (for example, metal) may be inserted into the gate stack layer of the second conductivity type to avoid full depletion of this layer. Embodiment 600 having such an optional conductive layer is shown in FIG. 6. Embodiment 600 is similar to the embodiment of FIG. 1B but with the p+ a-Si:H layer 112 split into layers 112_a_ and 112_b_, with conductive metal layer 602 inserted between them.

Note also that: (i) the $n^+$ c-Si:H layer 106_a_ and 106_b_ of FIGS. 1A and 1B is a non-limiting example of these layers; any ohmic contact can be used at the source and drain, including but not limited to doped hydrogenated crystalline or doped hydrogenated non-crystalline semiconductor material; and (ii) an n-type c-Si substrate has been used for illustrative purposes in many of the embodiments presented herein (that is, embodiments where the first conductivity type is n-type), but p-type embodiments may be used as well.

Figure 7A:
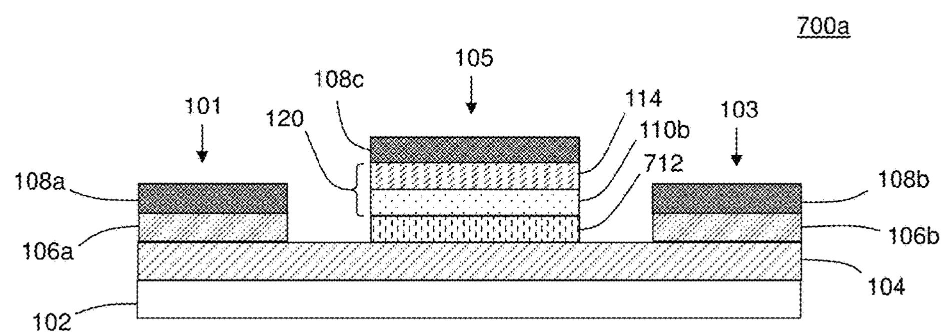
FIG. 7A is a cross-sectional view of a fourth embodiment semiconductor structure according to the present invention.
Figure 7B:
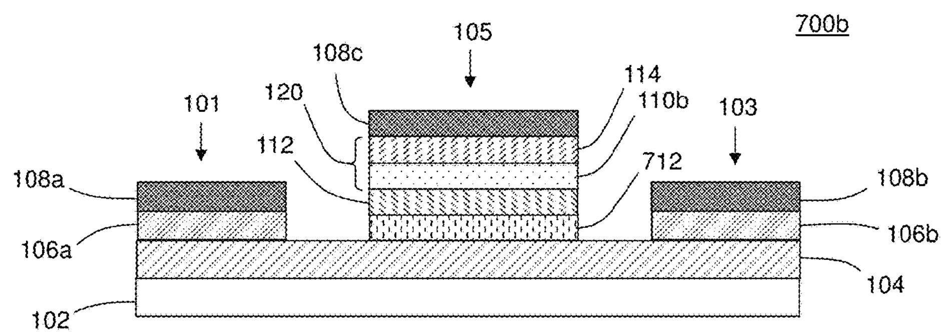
FIG. 7B is a cross-sectional view of a fifth embodiment semiconductor structure according to the present invention.

Other gate stack variations that include add-on layer 120 are also possible. A few additional examples of these alternatives are provided in FIGS. 7A, 7B, 8A, 8B, and 9A-E. HJFET 700_a_ of FIG. 7A, for instance, is similar to HJFET 100_b_ of FIG. 1B except for the substitution of crystalline layer 712 in place of non-crystalline layer 112 and the absence of optional intrinsic layer 110_a_ in gate stack 105. In this embodiment, layer 712 is a p+ c-Si:H doped hydrogenated crystalline semiconductor material of the second conductivity type grown epitaxially on top of crystalline substrate layer 104. Embodiment 700_b_ of FIG. 7B is similar, except layer 712 is present below layer 112 instead of substituted for it. In some embodiments, crystalline layers are only grown on top of other crystalline layers because the growth is epitaxial (that is, the layer follows the crystal structure of the layer onto which it is grown). In some embodiments, only the first layer of gate stack 105 grown is crystalline and the other layers in the gate stack are amorphous. As long as at least one layer in the gate stack is amorphous (that is, as long as there are adjacent semiconductor layers that have different band gaps), the device is considered an HJFET.

Figure 8A:
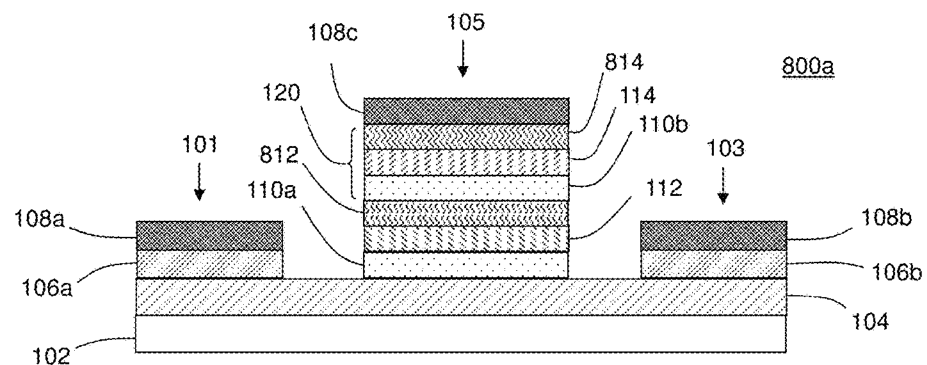
FIG. 8A is a cross-sectional view of a sixth embodiment semiconductor structure according to the present invention.

HJFET 800_a_ of FIG. 8A is similar to HJFET 100_b_ of FIG. 1B except for additional layers 812 and 814. Layer 812 is a doped hydrogenated non-crystalline semiconductor material layer of the second conductivity type and is comprised of a lower band gap semiconductor material than that of the doped hydrogenated non-crystalline semiconductor material layer 112. Layer 814 is a doped hydrogenated non-crystalline semiconductor material layer of the first conductivity type and is comprised of a lower band gap semiconductor material than that of the doped hydrogenated non-crystalline semiconductor material layer 114. In some embodiments, only one of the two additional layers 812 and 814 is used.

Figure 8B:
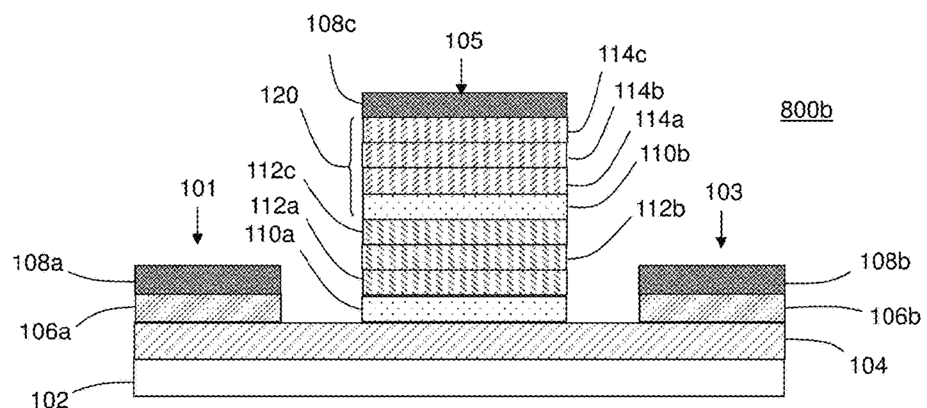
FIG. 8B is a cross-sectional view of a seventh embodiment semiconductor structure according to the present invention.

In HJFET 800_b_ of FIG. 8B, layers 112 and 114 of HJFET 100_b_ have each been replaced by multilayered stacks 112_a-c_ and 114_a-c_, respectively, where each multilayered stack comprises alternating layers of wide band gap and narrow band gap semiconductor materials, the terms "wide" and "narrow" being relative to each other. Note that although this and other embodiments depict an add-on layer 120 that is symmetric to the non-add-on portion of the gate stack in the sense of having the same number of sub-layers in each portion, this need not necessarily be the case. For example, in some embodiments, only one of the two layers 112 and 114 from FIG. 1B is a multilayer stack.

Shown in FIGS. 9A-E are Schottky JFET devices 900_a-e_, respectively, each according to an embodiment of the present invention. The Schottky junction may be formed, for example, by hydrogenated amorphous silicon and a conductive material such as metal or transparent conductive oxide. Further details about the contents and fabrication of Schottky JFET devices in general (but without blocking stack 120) can be found in Hekmatshoar-Tabari et al., "Thin film hybrid junction field effect transistor," US Patent Publication No. 20130328110 A1, filed Mar. 15, 2013.

Figure 9A:
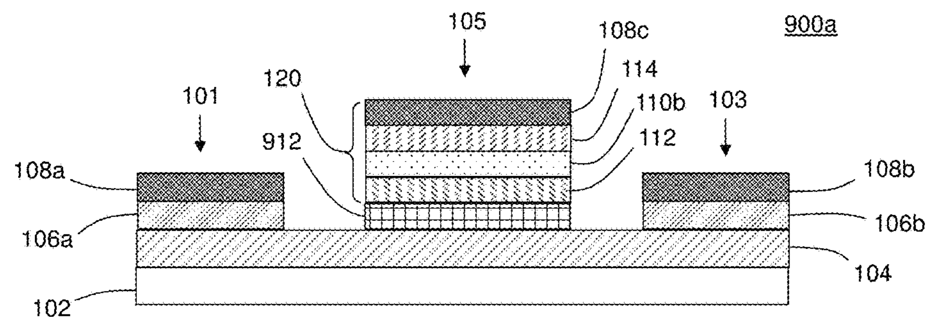
FIG. 9A is a cross-sectional view of an eighth embodiment semiconductor structure according to the present invention.

Schottky JFET 900_a_ of FIG. 9A includes Schottky gate contact 912 and a p-i-n blocking stack for blocking stack 120. In some embodiments: (i) Schottky gate contact 912 (formed, for instance, from metal, a metal-semiconductor alloy such as a silicide, or an appropriately doped metal-semiconductor alloy) has a high workfunction (for example, >4.5 eV) to make a Schottky contact with n-type SOI channel layer 104 but an ohmic contact with p+ a-Si:H layer 112; and/or (ii) top conductive layer 108_c_ has a low workfunction (for example, <4.0 eV) to make an ohmic contact with n+ a-Si:H layer 114.

Figure 9B:
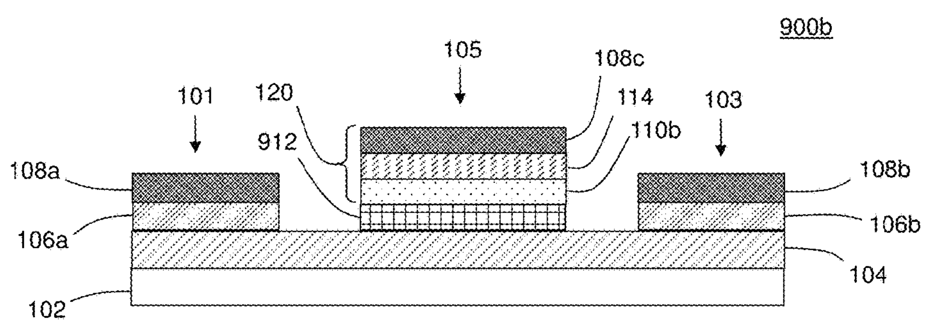
FIG. 9B is a cross-sectional view of a ninth embodiment semiconductor structure according to the present invention.

FIG. 9B shows Schottky JFET 900_b_, an embodiment similar to embodiment 900_a_ but without p+ a-Si:H layer 112. Like Schottky device 900_a_, JFET 900_b_ has Schottky gate contact 912 and blocking stack 120. Schottky gate contact 912 (metal, silicide, or other Schottky contact material) again may have a high workfunction (for example, >4.5 eV) to make a Schottky contact with n-type SOI channel layer 104. The potential barrier height of blocking stack 120, which is a Schottky blocking stack here, is approximately equal to the workfunction difference between Schottky gate contact 912 and n+ a-Si:H layer 114. Top conductive layer 108_c_ may have a low workfunction (for example, <4.0 eV) to make an ohmic contact with $n^+$ a-Si:H layer 114.

Figure 9C:
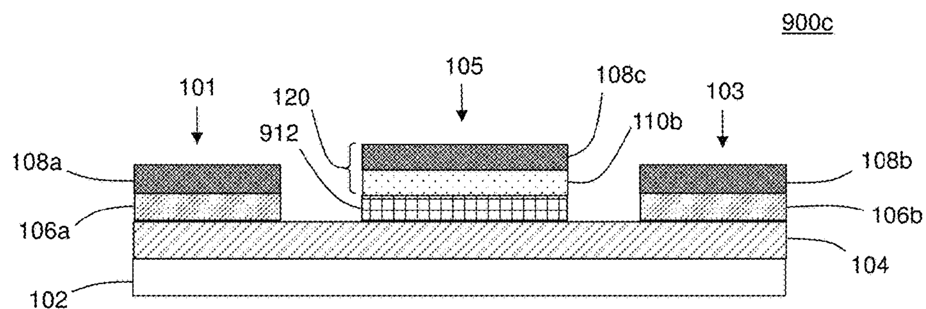
FIG. 9C is a cross-sectional view of a tenth embodiment semiconductor structure according to the present invention.

Shown in FIG. 9C is Schottky JFET 900_c_, an embodiment similar to embodiment 900_b_ but without n+ a-Si:H layer 114. Like Schottky JFET 900_b_, Schottky JFET 900_c_ includes Schottky gate contact 912 and a Schottky blocking stack for blocking stack 120. Schottky gate contact 912 (metal, silicide, or other Schottky contact material) again may have a high workfunction (for example, >4.5 eV) to make a Schottky contact with n-type SOI channel layer 104. Top conductive layer 108_c_ (metal, silicide, or other conductive material) may have a low workfunction (for example, <4.0 eV). The potential barrier height of blocking stack 120 is approximately equal to the workfunction difference between Schottky gate contact 912 and conductive layer 108_c_.

Figure 9D:
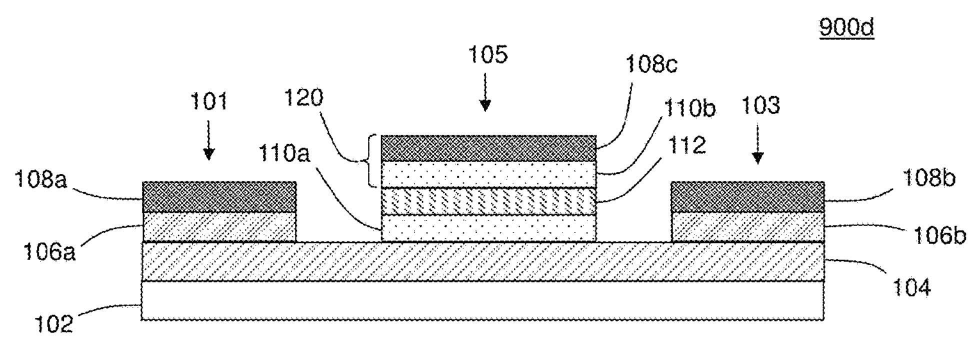
FIG. 9D is a cross-sectional view of an eleventh embodiment semiconductor structure according to the present invention.

Shown in FIG. 9D is Schottky HJFET 900_d_. Schottky HJFET 900_d_ includes heterojunction gate contact 110_a_ and 112 and a Schottky blocking stack (composed of intrinsic layer 110_b_ and conductive layer 108_c_) for blocking stack 120. There is no n+ a-Si:H layer 114. Top conductive layer 108*c* (metal, silicide, or other conductive material) may have a low workfunction (for example, <4.0 eV). The potential barrier height of blocking stack 120 is approximately equal to the workfunction difference between p+ a-Si:H layer 112 and conductive layer 108*c*. In other embodiments, a crystalline layer material such as p+ c-Si:H 712 may be used instead of bottom i a-Si:H layer 110*a* (for example, as in FIG. 7A), or p+ a-Ge:H (or some other material with a different band gap) may be added on top of (or inserted into) p+ a-Si:H layer 112 (for example, as in FIG. 8A).

Figure 9E:
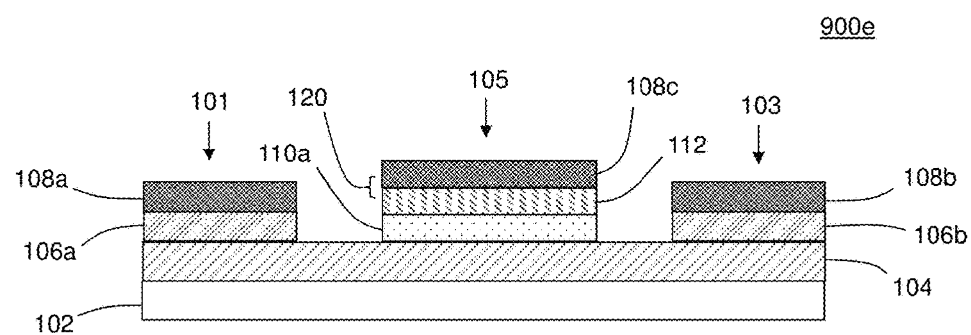
FIG. 9E is a cross-sectional view of a twelfth embodiment semiconductor structure according to the present invention.

Shown in FIG. 9E is Schottky HJFET 900*e*. Schottky HJFET 900*e* includes heterojunction gate contact 110*a* and 112 and a Schottky blocking "stack" for blocking stack 120 (in this case, the "stack" is the 112/108*c* Schottky junction). Top conductive layer 108*c* (metal, silicide, or other conductive material) may have a low workfunction (for example, <4.0 eV, or <3.5 eV) to form a Schottky junction with p+ a-Si:H layer 112. The potential barrier height of blocking "stack" 120 is approximately equal to the workfunction difference between p+a-Si:H layer 112 and conductive layer 108*c*. In other embodiments, a crystalline layer material such as p+ c-Si:H 712 may be used instead of bottom i a-Si:H layer 110*a* (for example, as is shown in FIG. 7A), or p+ a-Ge:H (or some other material with a different band gap) may be added on top of (or inserted into) p+ a-Si:H layer 112 (for example, as is shown in FIG. 8A).

Some embodiments of the present invention recognize that: (i) in some applications of interest, such as substrate preparation by layer transfer onto glass or plastic, only one type of substrate (n or p) is available; (ii) a JFET and a MOSFET can create complementary circuits, such as an inverter, on such a substrate; (iii) with a normally-ON JFET, however, full swing of the output voltage from approximately ground (GND) to approximately supply ($V_{DD}$) is not possible; (iv) with the JFET structure disclosed herein, normally-OFF devices are possible; and (v) as a result of (iv), full swing is feasible.

Figure 10A:
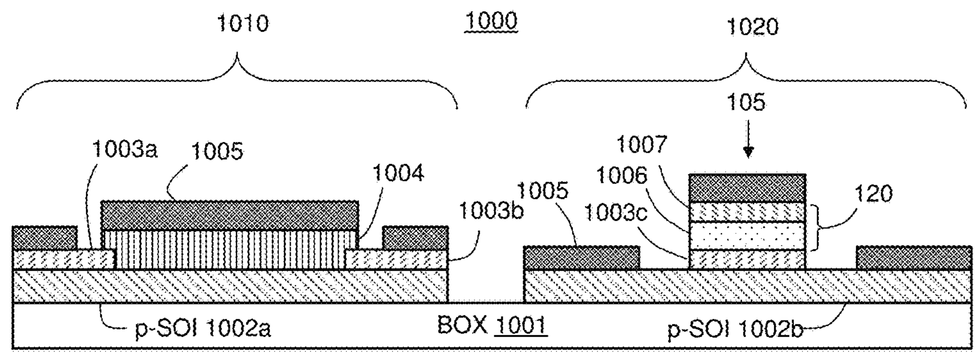
FIG. 10A is a cross-sectional view of an thirteenth embodiment semiconductor structure according to the present invention.

FIG. 10A illustrates such a device in the form of inverter structure 1000. Structure 1000 includes MOSFET 1010 and JFET 1020, both formed on top of buried oxide (BOX) 1001. Unlike the previous example embodiments formed on n-type substrates, structure 1000 is formed on p-type SOI c-Si substrates 1002*a* and 1002*b*. In addition to SOI 1002*a*, MOSFET 1010 includes: $n^+$ source and drain layer regions 1003*a* and 1003*b*; high relative permittivity (high-k) gate dielectric region 1004; and electrode layer regions 1005. In addition to SOI 1002*b*, JFET 1020 includes: $n^+$ gate layer region 1003*c*; intrinsic layer 1006 and $p^+$ gate layer region 1007 that together make up add-on layer 120 in this embodiment; and electrode contact layer regions 1005. JFET 1020 is a normally-OFF device, with a $V_P<0$ V. This structure is made practical by the inclusion of blocking stack 120 in gate stack 105 of the JFET.

Figure 10B:
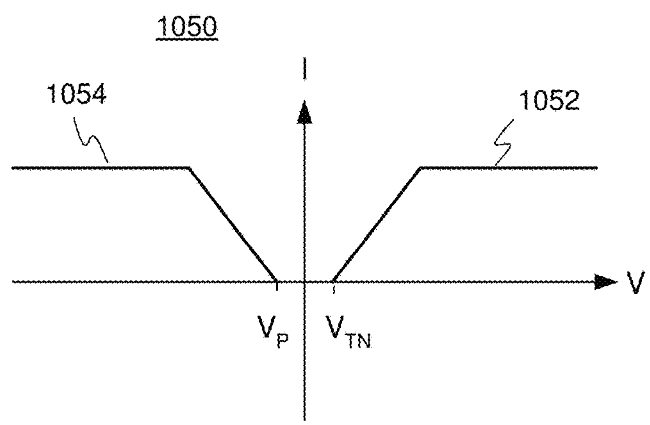
FIG. 10B is a graph showing information that is generated by and/or helpful in understanding the thirteenth embodiment semiconductor structure.

Graph 1050 of FIG. 10B shows the output current characteristics as a function of gate voltage for MOSFET 1010 (line 1052) and JFET 1020 (line 1054). As can be seen from the Figure, a $V_P$ of less than 0 V for JFET 1020 together with a threshold voltage ($V_{TN}$) greater than 0 V for MOSFET 1010 permits full-swing operation.

Figure 11A:
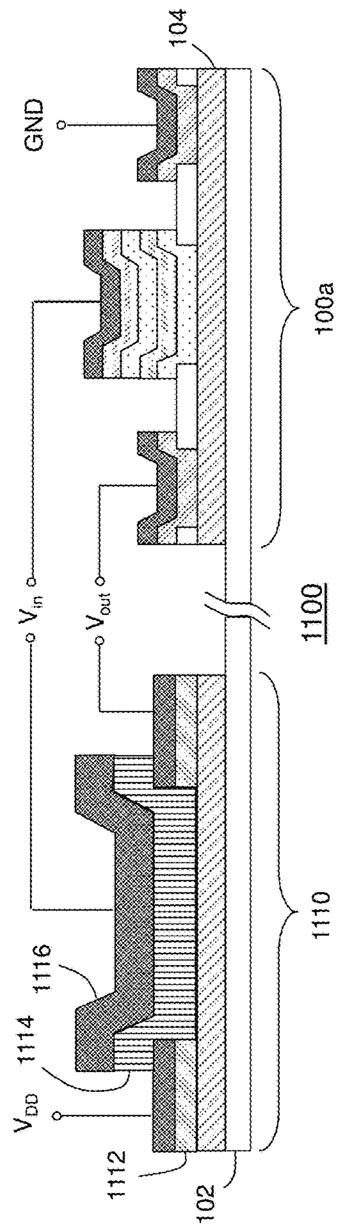
FIG. 11A is a cross-sectional view of a fourteenth embodiment semiconductor structure according to the present invention.
Figure 11B:
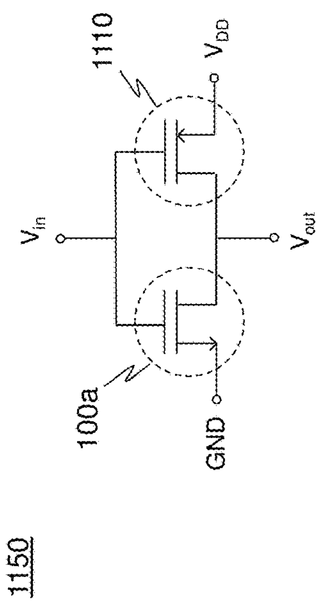
FIG. 11B is an electrical schematic of the fourteenth embodiment semiconductor structure.

FIG. 11A provides another illustration of a complementary circuit device in the form of inverter 1100. Inverter 1100 includes MOSFET 1110 and HJFET 100*a* (see FIG. 1A), both formed on top of BOX 102. Inverter 1100 is an n-type device, with both MOSFET 1110 and HJFET 100*a* fabricated on top of n-type c-Si substrate layer regions 104. The components of HJFET 100*a* have been previously described. The components of p-channel MOSFET 1110 include: 25 nm thick $p^+$ hydrogenated microcrystalline Si (μc-Si:H) source and drain layer regions 1112; 25 nm thick aluminum oxide ($Al_2O_3$) gate dielectric 1114; and electrode contacts 1116. Both the 1112 and 1114 layer regions are deposited at temperatures below 200° C. For purposes of demonstrating the application of HJFET devices to complementary circuits, MOSFET 1110 is connected externally to HJFET 100*a* as shown in the Figure. Note that this p-channel MOSFETs embodiment is only intended to demonstrate the feasibility of complementary function, so neither its structure (for example, the $Al_2O_3$ gate dielectric) nor fabrication process as described is necessarily optimal. FIG. 11A illustrates an inverter structure formed by connecting an n-channel HJFET and a p-channel MOSFET fabricated on the same n-type c-Si substrate. Schematic 1150 of FIG. 11B shows this same circuit component combining p-MOSFET 1110 and n-HJFET 100*a*, but with the structure abstracted away.

Figure 11C:
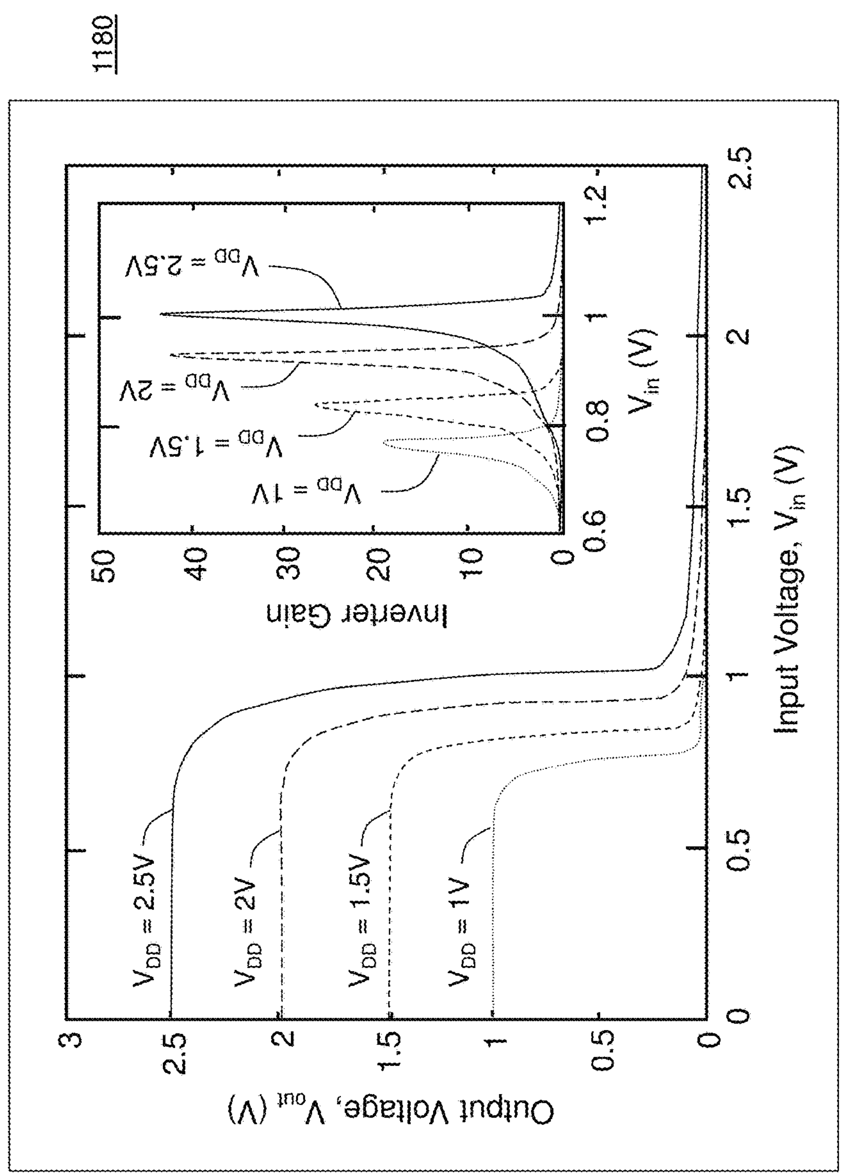
FIG. 11C is a graph showing information that is generated by and/or helpful in understanding the fourteenth embodiment semiconductor structure.

Shown in graph 1180 of FIG. 11C are the output characteristics of the HJFET/MOSFET inverter of FIG. 11A. Complementary function is observed for supply voltages as low as 1 V. The inverter gain increases from ~20 to ~40 by increasing the supply voltage from 1 V to 2.5 V. Inverter performance would likely improve by improving the p-channel MOSFET employed. While FIGS. 10A through 11C illustrated complementary circuit inverters, other circuits, such as static random access memory (SRAM) cells, pass transistors, latches, logic gates, and so on are similarly possible, as will be readily apparent to one of ordinary skill in the art in light of the present disclosure.

In all of the embodiments described herein, a back-gate electrode may be optionally included by either disposing the buried insulator (such as BOX 102) on a conductive substrate (carrier substrate), or on a semiconductor substrate in contact with a conductive electrode. As known in the art, applying a bias voltage to the back-gate of a MOSFET modulates the Fermi level inside the channel material (such as SOI 104), modulating the threshold voltage of the MOSFET accordingly. Similarly, applying a back-gate voltage to a JFET modulates the Fermi level in the channel material and modulates the pinch-off voltage accordingly. In some embodiments, the disclosed JFET/MOSFET inverters or other complementary circuit devices disposed on the same substrate may share a common back gate.

Figure 12A:
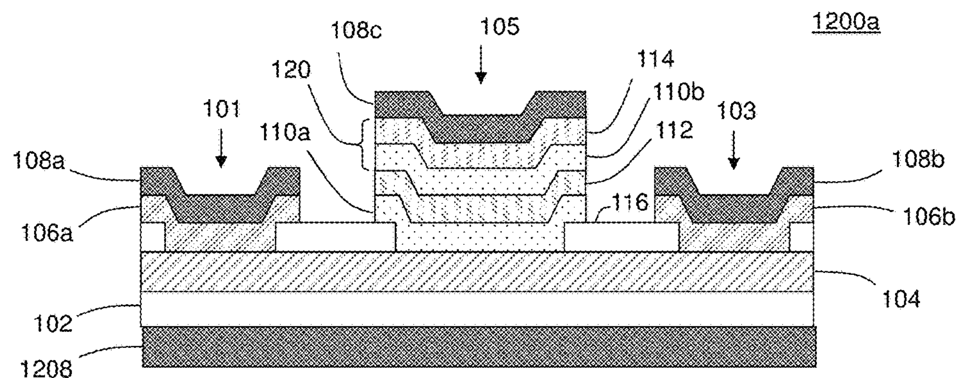
FIG. 12A is a cross-sectional view of a fifteenth embodiment semiconductor structure according to the present invention.
Figure 12B:
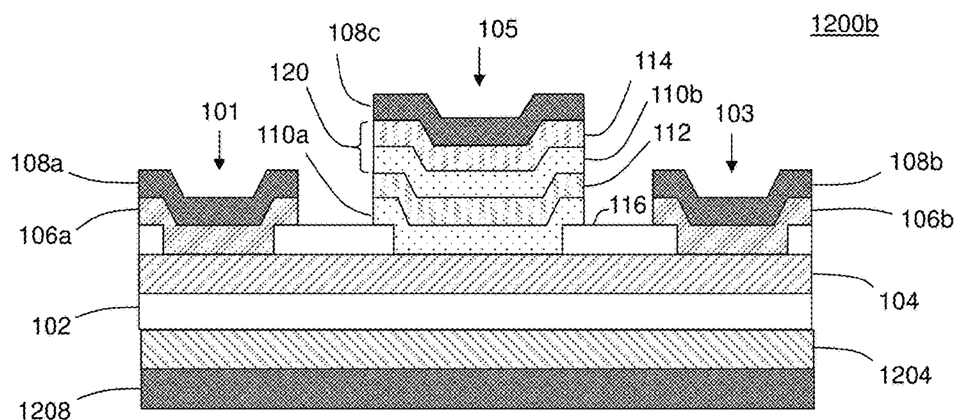
FIG. 12B is a cross-sectional view of a sixteenth embodiment semiconductor structure according to the present invention.

Devices 1200*a* and 1200*b* are examples of back gate embodiments of the present invention. These are presented in FIGS. 12A and 12B, respectively. Devices 1200*a* and 1200*b* are similar to HJFET device 100*a* of FIG. 1A except for the addition of a back gate, formed by BOX 102 directly on conductive substrate 1208 (such as metal) in FIG. 12A, and by BOX 102 on semiconductor carrier substrate 1204 on conductive electrode 1208 in FIG. 12B.

Figure 12C:
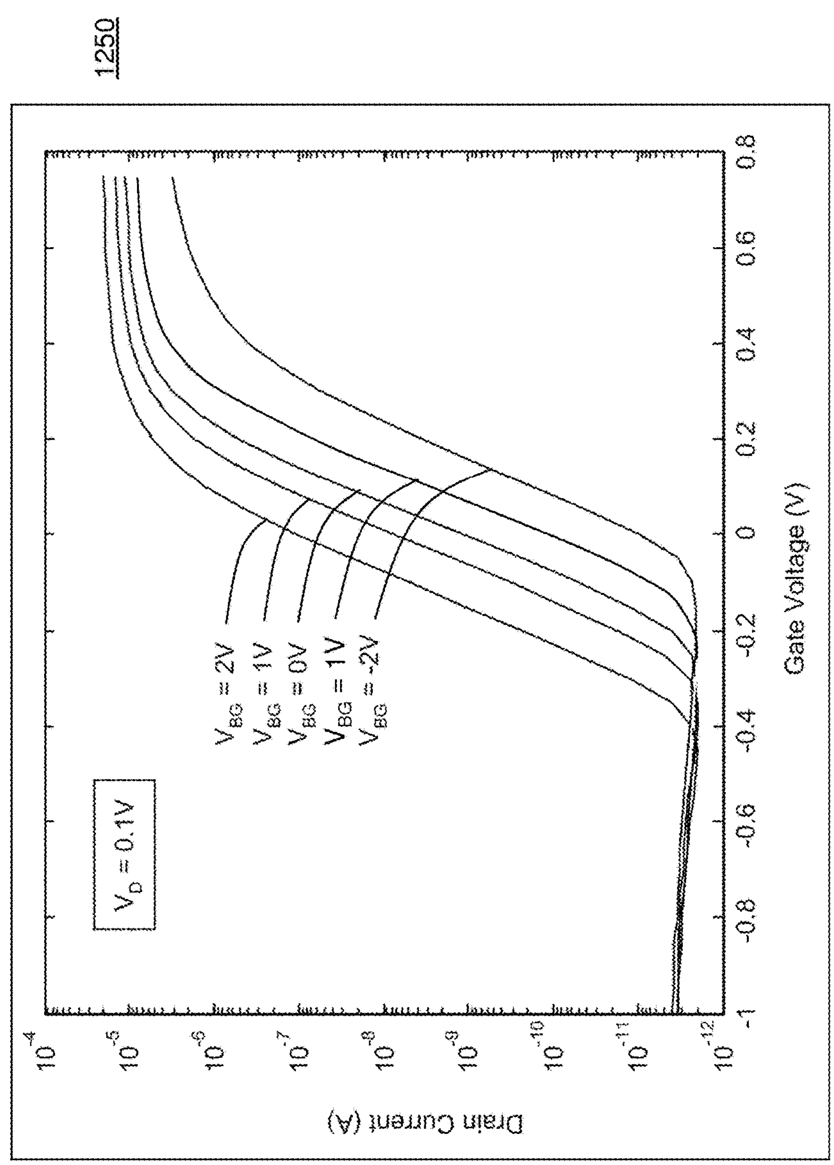
FIG. 12C is a graph showing information that is generated by and/or helpful in understanding the fifteenth embodiment semiconductor structure.
Figure 12D:
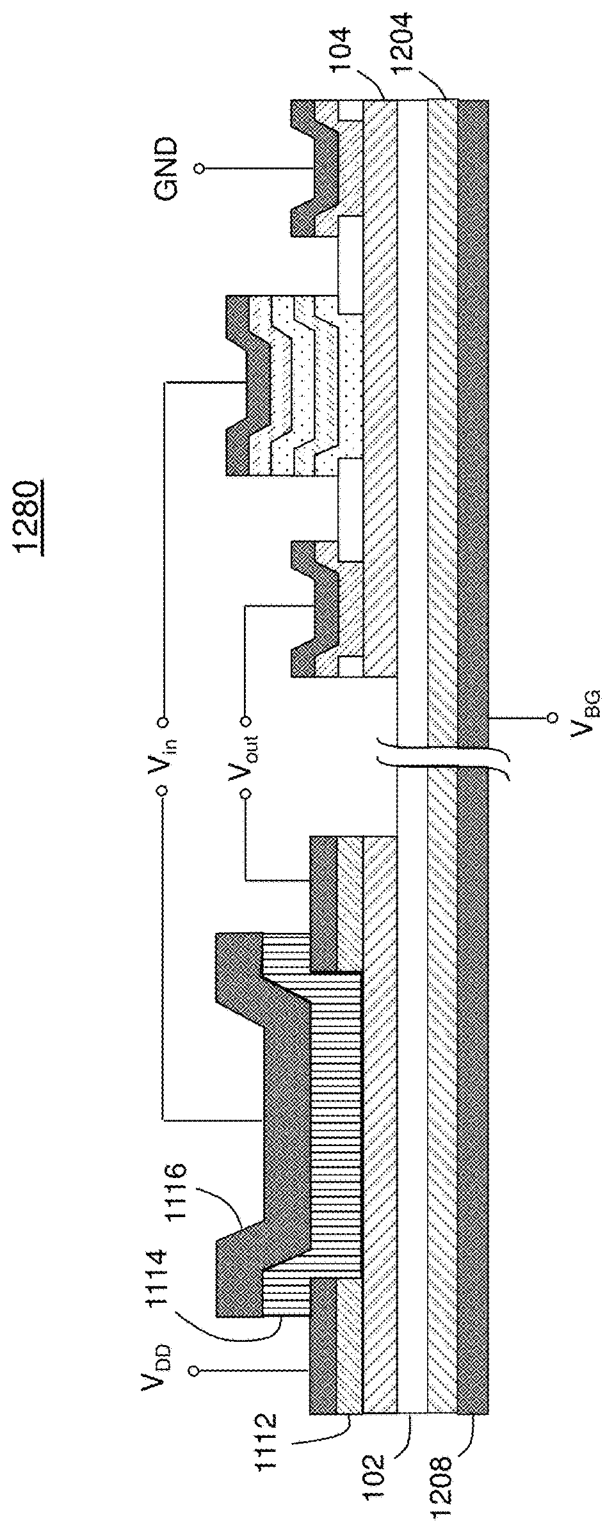
FIG. 12D is a cross-sectional view of a seventeenth embodiment semiconductor structure according to the present invention.

FIG. 12C presents graph 1250, showing the transfer characteristics of HJFET 1200*b* (that is, having a carrier substrate). $V_{BG}$ is back-gate voltage and $V_D$ is drain voltage. Finally, FIG. 12D shows inverter 1280, like inverter 1100 of FIG. 11A but with back-gate electrode formed by carrier substrate 1204 on conductive electrode 1208 (as discussed above, the carrier substrate may be omitted in some embodiments).

In some embodiments of the present invention, a thin blocking structure is incorporated in the gate stack of heterojunction field-effect transistor (HJFET) devices to substantially suppress the gate current when the gate heterojunction is forward-biased. As a result, normally-OFF HJFET devices with MOSFET-like characteristics can be obtained. The HJFET devices are comprised of gate, source and drain regions that may be formed, for example, by plasma-enhanced chemical vapor deposition on thin-film crystalline Si substrates at temperatures below 200° C. In some embodiments of the present invention, ON/OFF ratios may be larger than $10^6$, operation voltages as low as 1 V, and/or subthreshold slopes of ~85 mV/dec may be obtained. The HJFET devices can be integrated with MOSFET devices fabricated on the same crystalline Si substrates to form complementary circuits.

Some embodiments of the present invention include: (i) JFET devices where the gate is comprised of a semiconductor junction; (ii) normally-OFF thin-film silicon heterojunction field-effect transistors (HJFETs); (iii) normally-OFF thin-film HJFET devices with low-temperature PECVD contacts on crystalline Si (c-Si) substrates; (iv) suppression of gate current of HJFET devices by incorporating a blocking stack in the gate; (v) JFET devices with the gate region comprised of a p/n/p or n/p/n junction (with or without optional i layers); and/or (vi) complementary circuits formed by integration of any of the JFET devices above with MOSFET devices fabricated on the same c-Si substrates.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. For example, layer formation processes for the various layers of the devices disclosed herein may include chemical vapor deposition (CVD), PECVD, hot-wire chemical vapor deposition (HWCVD), atomic layer deposition, sputtering, plating, and/or other techniques, while the semiconductor, metal, insulator, and/or alloy materials used may include silicon (Si), germanium (Ge), carbon (C), and many other elements either alone or in various combinations known to those of ordinary skill in the art. The terminology used herein was chosen to best explain the principles of the embodiment, the practical application or technical improvement over technologies found in the marketplace, or to enable others of ordinary skill in the art to understand the embodiments disclosed herein.

The following paragraphs set forth some definitions for certain words or terms for purposes of understanding and/or interpreting this document.

Present invention: should not be taken as an absolute indication that the subject matter described by the term "present invention" is covered by either the claims as they are filed, or by the claims that may eventually issue after patent prosecution; while the term "present invention" is used to help the reader to get a general feel for which disclosures herein are believed to potentially be new, this understanding, as indicated by use of the term "present invention," is tentative and provisional and subject to change over the course of patent prosecution as relevant information is developed and as the claims are potentially amended.

Embodiment: see definition of "present invention" above—similar cautions apply to the term "embodiment."

and/or: inclusive or; for example, A, B "and/or" C means that at least one of A or B or C is true and applicable.

Electrically connected: means either directly electrically connected, or indirectly electrically connected, such that intervening elements are present; in an indirect electrical connection, the intervening elements may include inductors and/or transformers.

Crystalline material: any material that is single-crystalline, multi-crystalline, or polycrystalline.

Non-crystalline material: any material that is not crystalline; including any material that is amorphous, nano-crystalline, or micro-crystalline.

Intrinsic material: a semiconductor material which is substantially free of doping atoms, or in which the concentration of dopant atoms is less than $10^{15}$ atoms/$cm^3$.

Heterojunction: any junction formed between two semiconductor materials having different band gaps, for example, c-Si/a-Si:H (contrasted with a junction formed between two semiconductors having the same band gap, such as c-Si/c-Si:H, known as a "homojunction").

Blocking stack: with respect to the gate of a junction field-effect transistor (JFET) device, a structure that substantially suppresses gate current when the gate junction is forward-biased; may include one or more layers of metal and/or semiconductor materials, and/or a Schottky junction.

Complementary: with respect to field-effect transistors (FETs), a pair of FETs that respond in opposite fashion to a given gate voltage; that is, when one member of the pair is on, the other is off, and vice versa.

What is claimed is:

1. A junction field effect transistor (JFET) comprising:

a channel region; and a gate region comprised of a non-crystalline material selected from a hydrogenated amorphous semiconductor material;

wherein:

the gate region comprises a first gate sub-region and a second gate sub-region;

the first gate sub-region forms a junction with the channel region;

the second gate sub-region forms a junction with the first gate sub-region;

the channel region and the second gate sub-region include material of a first conductivity type; and the first gate sub-region includes material of a second conductivity type different from the first conductivity type.

2. The JFET of claim 1, wherein:

the first conductivity type is p-type; and the gate region forms a (i) p/n/p, (ii) p/i/n/p, (iii) p/n/i/p or (iv) p/i/n/i/p junction with the channel region.

3. The JFET of claim 1, wherein:

the first conductivity type is n-type; and the gate region forms an (i) n/p/n, (ii) n/i/p/n, (iii) n/p/i/n or (iv) n/i/p/i/n junction with the channel region.

4. The JFET of claim 1, wherein one of the gate sub-region junctions is a Schottky junction.

5. The JFET of claim 1, wherein the JFET comprises a thin-film transistor.

6. The JFET of claim 1, wherein the channel region and the gate region are located above a support substrate.

7. The JFET of claim 1, wherein the JFET is a heterojunction JFET (HJFET).

8. The JFET of claim 1, wherein the channel region is comprised of a crystalline material.

9. The JFET of claim 8, wherein the crystalline material is crystalline hydrogenated silicon.

10. The JFET of claim 1, wherein the amorphous hydrogenated semiconductor material is amorphous hydrogenated silicon.

11. The JFET of claim 1, wherein end portions of the gate region are located on a passivation material layer portion.

12. A junction field effect transistor (JFET) comprising:

a channel region; and a gate region comprised of a non-crystalline material selected from a hydrogenated amorphous semiconductor material;

wherein:

the gate region forms a junction with the channel region;

the gate region includes at least one Schottky junction; and the gate region includes a blocking stack.

13. The JFET of claim 12, wherein the JFET is part of a complementary circuit.

14. The JFET of claim 12, wherein the channel region is comprised of a crystalline material.

15. The JFET of claim 14, wherein the crystalline material is crystalline hydrogenated silicon.

16. The JFET of claim 12, wherein the amorphous hydrogenated semiconductor material is amorphous hydrogenated silicon.

17. The JFET of claim 13, wherein end portions of the gate region are located on a passivation material layer portion.

* * * * *